United States Patent [19]

McKeighen et al.

[11] 4,401,957
[45] Aug. 30, 1983

[54] PERMUTATING ANALOG SHIFT REGISTER VARIABLE DELAY SYSTEM

[75] Inventors: Ronald E. McKeighen, Hoffman Estates, Ill.; Michael P. Buchin, Palo Alto, Calif.

[73] Assignee: Siemens Gammasonics, Inc., Des Plaines, Ill.

[21] Appl. No.: 230,323

[22] Filed: Feb. 2, 1981

Related U.S. Application Data

[60] Division of Ser. No. 50,002, Jun. 8, 1979, Pat. No. 4,267,584, which is a continuation-in-part of Ser. No. 812,109, Jul. 1, 1977, Pat. No. 4,173,007.

[51] Int. Cl.³ .................... H03H 17/08; G11C 19/28
[52] U.S. Cl. ............................... 333/165; 333/166; 357/24
[58] Field of Search ............... 333/165, 166, 167; 307/221 D; 357/24, 51, 24 LR; 364/824, 825, 862; 377/57–63

[56] References Cited

U.S. PATENT DOCUMENTS

| | | | |
|---|---|---|---|
| 3,787,852 | 1/1974 | Puckette et al. | 333/165 X |
| 4,205,283 | 5/1980 | Donally, Jr. | 307/221 D |
| 4,219,813 | 8/1980 | Collins | 357/24 X |

*Primary Examiner*—Marvin L. Nussbaum
*Attorney, Agent, or Firm*—Karl F. Milde, Jr.

[57] ABSTRACT

A dynamically variable electronic delay line for real time ultrasonic imaging systems is disclosed which controllably phases the signals associated with an array of electromechanical transducer elements and thereby enables selective scanning and dynamic focusing of a target. A controllable variable electronic time delay apparatus is coupled to each of the electromechanical transducer elements of the array having separate write-in and read-out addressing capabilities. The signals associated with a respective ultrasonic transducer element are fed in at selected write-in addresses and subsequently read-out and extracted after an initial time delay interval. The write-in and read-out address pointers of the memory system are continuously sequenced during operation of the device and the time delay interval is a function of the difference between the addresses and the clock rate. The initial delay can be varied instantaneously by modifying either the write-in or the read-out address pointer during the sequencing thereof, such modification being defined as an "edit-splice" technique. In the preferred embodiments of the invention, the time delay apparatus comprises a trio of analog shift register memories of the change coupled device (CCD) type for each transducer section together with commutating write and read means. Both the write and read means for each CCD trio are independently controllable for use in an "edit-splice" imaging system.

1 Claim, 12 Drawing Figures

PERMUTATING ANALOG SHIFT REGISTER VARIABLE DELAY SYSTEM

BACKGROUND OF THE INVENTION

This application is a division of co-pending application Ser. No. 050,002, filed June 18, 1979, now U.S. Pat. No. 4,267,584, which application 050,002 is in turn a Continuation-In-Part application Ser. No. 812,109 filed July 1, 1977, now U.S. Pat. No. 4,173,007.

This invention generally has particular advantages in ultrasonic imaging systems and is concerned with the provision of a dynamically variable electronic delay line composed of analog shift register memory device. As set forth herein, the inventive system provides a real time ultrasonic imaging system by which the signals associated with an array of electromechanical acoustic transducer elements are controllably phased to enable selective scanning and dynamic focusing of a target.

In an ultrasonic imaging system of the type wherein a plurality of transmitting and receiving electro-mechanical transducer elements are disposed in an array, the scanning angle and focal distance for the acoustic signals both transmitted and received by the transducer elements can be selected by carefully controlling the timing of the signals associate with each transducer element, to the end that the acoustic pulses transmitted from each of the transducer elements of an array all arrive at the same time at a particular target disposed at a particular scanning angle and focal distance, and such that the return or "echo" signal received by each of the transducer elements are properly phased so as to be processed, i.e. coherently summed, at the same time.

Figure 1:
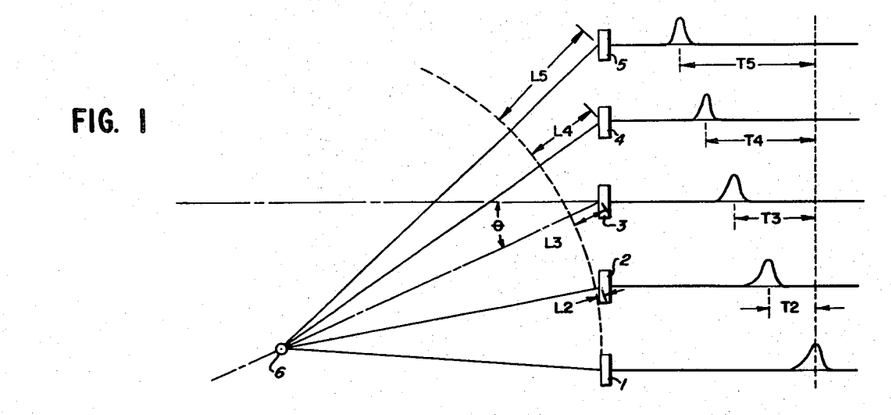
FIG. 1 is a diagramatic illustration of the principle of beam steering in association with an array of electro-mechanical acoustic transducer elements.

More specifically, and with initial reference to FIG. 1 of the appended drawings, a typical phased-array of electro-mechanical transducer elements could comprise elements 1 thru 5, each physically spaced-apart, one from the other, by a selected linear distance. Each of the electro-mechanical acoustic transducer elements 1 thru 5 serve to convert an electronic pulse signal presented thereto into an acoustic pulse and transmit same. Similarly, the return acoustic "echo" pulses received by each of the electro-mechanical transducer elements 1 thru 5 would be reconverted into electric pulses for processing and ultimate image display. If it is desired, for example, to focus upon a remote target disposed at some angle $\theta$ such as indicated by reference numeral 6, it would be necessary that each of the acoustic pulses transmitted by the plurality of transducer elements 1 thru 5 arrive at the location of the remote target 6 at the same time. In this respect, it is clear that the acoustic pulses transmitted from transducer elements 2 thru 5 would have to travel a respectively increased distance represented by reference designations L2 thru L5, respectively, as compared with the acoustic pulse transmitted from acoustic pulses travelling within the medium between the transducer elements and the remote target 6 is known, by creating a time delay between the transmission of the acoustic pulses from each of the respective transducers, time synchronism of all transmitted pulses at the remote target 6 can be assured. For example, the additional distance L5 that the acoustic pulse from transducer element 5 would have to travel can be compensated for, as contrasted with the acoustic pulse from transducer element 1, by causing the pulse transmitted by transducer element 5 to occur at a certain time interval T5 prior to the transmission of the acoustic pulse from transducer element 1.

When receiving "echo" signals that have been reflected from the target 6, similar time-delay considerations would apply. Specifically, since the signal received by transducer element 5 would be received at a time interval T5 subsequent to the receipt of the signal by transducer element 1 due to the additional distance L5 that such signal would have to travel, it would be necessary to shift or delay the signal at transducer element 1 through a time delay T5 so as to assure coherence, i.e. coincidence or propr phasing of such signal at transducer element 1 with the signal at transducer element 5. Similar considerations apply with respect to each of the signals from transducer elements 2, 3 and 4, for example, to the end that all signals received are placed into time coincidence, one with the other, for subsequent processing in accordance with conventional techniques.

As should be apparent, by altering the relative time delay of both transmission and receipt of signals at each of the respective transducer elements 1 thru 5, in effect a change in the scanning angle can be obtained. The acoustic beam transmitted and received by the plurality of transducer elements in the array can therefore be swept or steered through any desired sector, without the necessity of mechanical movement of the transducer elements per se.

Figure 2:
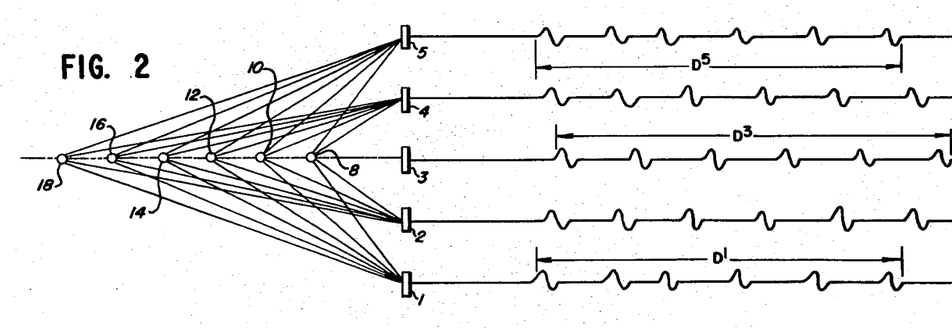
FIG. 2 is a diagramatic illustration of the principle of dynamic focusing of the beam associated with an array of electro-mechanical accoustic transducer elements.

In addition to the capabilities of sweeping an ultrasonic beam, a phased array of transducer elements is also required to selectively focus the beam at any desired focal distance. For example, and with reference now to FIG. 2 of the application drawing, a phased linear array of electro-mechanical transducer elements 1 thru 5 are again depicted, the array being desired in this instance to selectively focus on any given one of the remote objects or target reflectors 8 thru 18, these remote targets being disposed at varying distances from the linear array along the normal to such array in this instance. As shown in FIG. 2, the first signal received by the array of transducer elements 1 thru 5 is that which is reflected from target 8, target 8 being at a first distance from the line of the array. The second signal received by the array of transducer elements would be that which was reflected from remote target 10, for example, and so-on, through remote target 18 each target being at a ever-increasing focal distance from the line of the array. The signals received by each of the transducer elements 1 thru 5 from the respective remote target reflectors 8 thru 18 illustrated by the pulses as shown, with the first-received pulse such as would be obtained from the reflection from target reflector 8, for example, being that pulse to the far right-hand side of the pulse series representation, and with the last pulse received by each transducer element 1 thru 5, such as from target reflector 18, for example, being the sixth pulse, or the pulse represented at the far left-hand side of the pulse series representation from each transducer.

It is evident from these illustrations that to focus upon signals received from a target reflector 8 at the given focal distance of same, the first pulse received by transducer elements 2 and 4, for example, would have to be delayed in time by a somewhat shorter time interval, to the end so that the first received pulse from each of the transducer elements 1 thru 5 would be in time coincidence with one other, or properly phased. The time corrections necessary to focus or phase the signals received from the different focal distances of the various targets reflectors 10 thru 18 would similarly have to be adjusted, one with respect of the other, so that the second signal received by each of the transducer elements, such as that which would be reflected from target 10, would be in time coincidence with one another for subsequent processing, and such that the third signal received by all of the transducer elements from target reflector 12 at its given distance would similarly be in time coincidence or proper phase with one another for subsequent processing.

In effect, the schematic illustration of FIG. 2 depicts a situation by which so-called dynamic focusing at different distances during a series of pulses are obtained, with the first pulse received being from target reflector 8, and with the last pulse received being from target reflector 18, and with the entire string of echoes respectively received by each of the transducer elements being represented by the pulse series as shown. An interesting observation can be made in this example by noting that the data vectors $D_1$ and $D_5$, while being the same length as one another due to the placement of the target reflectors along with the normal to the linear transducer element array, are shorter than the data vector $D_3$ representing the pulse series received by transducer element 3. The proper amount of time delay must be introduced into each channel represented by the transducer element 1 thru 5 so that each respective corresponding echo or pulse signal in each channel are lined up with one another. Such proper "phasing" in a dynamic focusing mode can be obtained by either effectively shortening data vector $D_3$ to match the length of data vectors $D_1$ and $D_5$, or by alternatively stretching the data vectors $D_1$ and $D_5$ to line up with the data vector $D_3$. Similar considerations, of course, would apply to the data vectors associated with transducer elements 2 and 4.

The first step in lining up the received signals would be to bring the first-received signal in each data channel from the target reflector closest to the array into time coincidence with one another. As is noted from the illustration, to achieve such coincidence, for the first received signals from each transducer element, a relatively long delay would be required as between transducer elements 3 and 5, or 1 and 3, with an incrementally lesser initial delay being necessary as between transducer elements 2 and 3, or 3 and 4.

Once these first-received signals are placed into time coincidence, the amount of the initial delay provided in each of the respective channels must then be repeatedly trimmed in small increments so as to bring into proper focus the subsequently received echo signals for such channels, i.e., so as to achieve a true dynamic focus or zoom lens effect. For example, the delay necessary to bring into time coincidence the second-received signals such as from target reflector 10 would not be the identical delay that was required to bring into time coincidence the first received signals from echo reflector 8 due to the different distance of travel of the signals. Accordingly, if a given initial delay were selected for each of the respective data channels associated with each of the respective transducer elements so as to properly focus the first-received signals, this delay must then be incrementally changed by a small amount for each of the subsequently received signals so as to dynamically focus on each of the target objects in sequential order. At the ultrasonic frequencies of interest as are typically used in ultrasonic imaging environments, and considering that it is desirable to focus to an accuracy of ¼ of a wave length or less, a suitable delay mechanism must provide incremental delay changes as short as 100 nanoseconds, and also be capable of providing initial delays as long as twelve microseconds.

Figure 3:
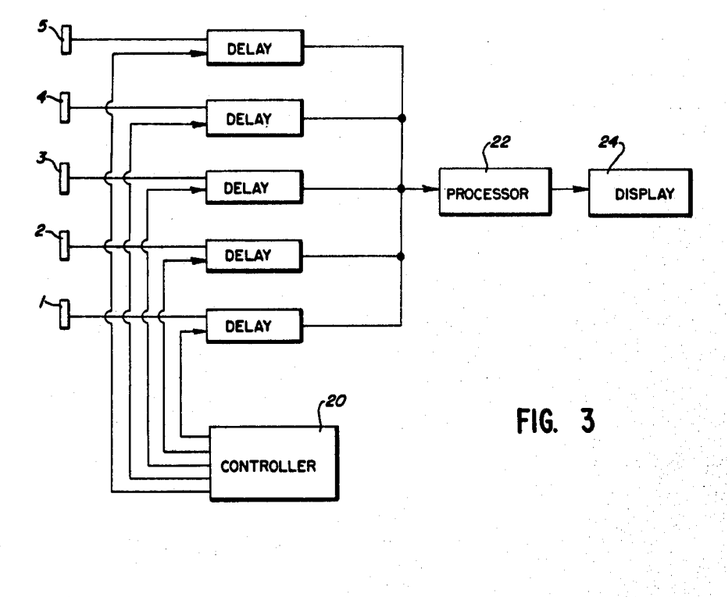
FIG. 3 is an electrical schematic illustration of a phased array of ultrasonic electro-mechanical acoustic transducer elements depicting the utilization of independent, controllable variable delay elements in association with each data channel or transducer.

In practice, the selection of the scanning or sweeping angles, as well as the selection of the focusing distances as above-discussed are achieved through the placement of a controllable variable delay line in each of the data channels associated with each respective transducer element of an array as is depicted in FIG. 3 of the application drawings, for example. As has been shown, the proper selections of the time delay values for each of the respective delays, and the proper switching or incrementing of such delay values for each of the received pulses, readily brings about the control of beam angle and focal length in an imaging system. This control over the time delay interval of each time element is effected through a well-known process by which transducer elements 1 thru 5 are each respectively brought into phase with one another, for subsequent processing in a processor 22, and ultimate image display in a display apparatus 24 as known.

Numerous difficulties are encountered, however, in attempting to implement the requisite delay specifications through the use of switched analog delay lines as are typically provided in the prior art system. Such switched analog delay lines resulted in portions of the signals being inserted out of sequence, a process which leads to image artifacts in the display. Furthermore, the long lumped-constant delay lines utilized in prior-art approaches are physically bulky, are quite expensive, and serve to introduce insertion losses, phase distortion, and timing inaccuracies.

Thus, while the theoretical basis of real time ultrasonic imaging is known, practical problems in the provision of delay elements capable of the high requirements imposed have inhibited the diagnostic use of such imaging with the attendant beam steering and dynamic focusing of a fixed ultrasonic transducer array.

SUMMARY OF THE INVENTION

It is thus apparent that a need exists in the ultrasonic imaging art for a dynamically variable electronic delay line which overcomes the problems associated with the switchable analog delay lines of the prior art, and enables real time ultrasonic imaging. It is the primary objective of the instant invention to provide such a dynamically variable electronic delay line.

In an ultrasonic imaging system having plurality of electroacoustic transducer elements which are disposed in a predetermined arrangement convenient for positioning relative to a patient anatomy and having means for energizing the transducer elements and processing echo signals returning thereto in a predetermined sequence in order to launch and receive a scanned dynamically focused acoustic beam; variable delay means are provided which comprise a plurality of analog shift register memory devices, permutation means for sequencing and permutating information storage and retrieval to and from the memory devices such that the information storage and retrieval may be independently operated, and edit/splice means for altering the time interval between the operations of information storage and retrieval to produce dynamic variation of system delay.

BRIEF DESCRIPTION OF THE DRAWINGS

The invention itself will become better understood and further features and advantages thereof will become apparent from the following detailed description of preferred inventive embodiments, which description refers to the appended sheets of drawings, wherein.

DETAILED DESCRIPTION OF THE DRAWINGS

With reference now to the drawings, the instant invention will be seen to comprise a controllable, variable electronic memory mechanism which is contemplated to be utilized as the delay element of an ultrasonic imaging system of the type depicted in FIG. 3 of the application drawings.

Figure 4A:
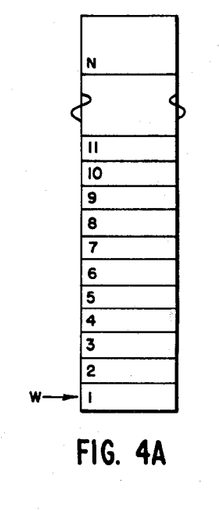
FIGS. 4A thru 4C schematically depict the operation of a sequentially addressable electronic digital memory apparatus in accordance with the technique of the instant invention, such electronic memory being shown with independent and simultaneously accessible write-in and read-out ports.
Figure 4B:
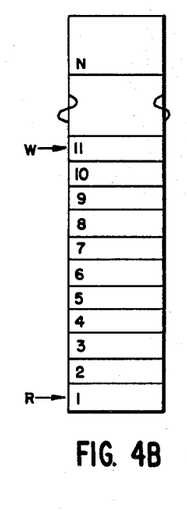
Figure 4C:
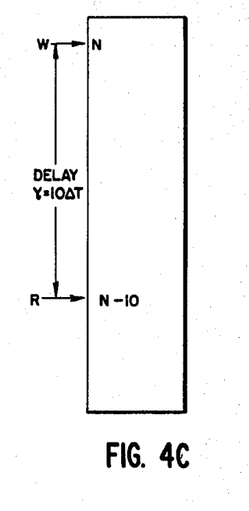

With particular reference to FIGS. 4A thru 4C of the application drawings, one technique for generating an electronic delay line is depicted, this technique involving the temporary storage of digital data in a buffer memory, so as to be read-out at a later time and thus create a time delay. As shown, the device of each of FIGS. 4A thru 4C is contemplated to comprise an addressable electronic memory integrated circuit apparatus having separate write-in and read-out addressing capabilities and a plurality of storage positions or cells. Data constituting the echo pulses, for example, received by an electro-mechanical acoustic transducer element would be inputted through a high speed ADC into the memory stack at a selected write-in address. Initially, for example, the data could be entered at address position 1 as is shown. The write-in address of the memory device would be sequenced to the next higher number at a given clock rate, for example, which could comprise 10 Megahertz at the ultrasound frequencies of interest. Thus, each new data pulse would be entered sequentially increasing storage positions, at the clock rate.

If it was desired to generate a time delay of one microsecond then in the instance under consideration herein and when the write-in address reached level 11 on the memory stack or device as depicted in FIG. 4B, the stored data would begin to be read-out of the device at a read-out address 1 as shown. From that point on, both the write-in and the read-out addresses would sequence up the memory stack simultaneously together, maintaining the ten position difference therebetween so that all data written in would automatically be read out at a read-out address ten positions behind the write-in address which, in accordance with a presupposed clock rate, would generate the one microsecond delay. This is illustrated in FIG. 4C of the application drawings, wherein the delay $\tau = 10\Delta T$, wherein $\Delta T$ is the clock period.

When the top of the memory device or stack was reached, bearing in mind that the number of memory positions of the integrated circuit is necessarily limited, the write pointer or address would "scroll over" to the bottom of the stack, i.e. to address position 1, wherein it would continue to sequence up the stack. Similarly, when the read-out address pointer reached the top of the stack, such address would "scroll-over" to begin anew at the bottom of the memory stack, or address position 1, and from that position continue its upward sequencing.

If it is desired to focus to a new target distance, or to sweep to a different beam angle, it is necessary that the delay generated by the memory device of FIGS. 4A thru 4C be altered. For example, let it be assumed that upon the reception of a suitable control signal, it is desired that subsequent data entering the memory device receive a 1.2 microsecond delay, instead of the 1 microsecond delay previously discussed. This delay can readily be implemented in the following exemplary manner.

Upon receipt of the control signal requesting an additional delay, the current address of the write pointer could be arithmetically incremented by two, and a new address value reassigned to it. Alternatively, one could incrementally delay or freeze the value of the read-out address by marking time of such address for two clock cycles, then release such addresses so that the read-out address can sequentially advance up the stack. In either event, the data read-out by the read-out address pointer would have experienced a delay of 1.2 microseconds as with respect to the new data being written in, instead of 1 microsecond delay previously discussed.

Depending on whether the middle transducer, or one of the end transducers of a transducer array is chosen as a reference point, it can be appreciated that the delays required for implementing a zoom focus or dynamic focus, for example could be obtained with either totally incrementing changes or totally decrementing changes. Decrementing changes, with the utilization of external controlling circuitry, may be obtained by the marking time of the clock controlling the write-in address sequencing, or incrementing the read-out address pointer. Freezing the read-out address serves to increase the instantaneous time delay, in dependence upon the number of clock pulses lost. Freezing the write-in address serves to shorten the delay from its original preselected value, again in accordance with the number of clock cycles lost. Lastly, and as can be appreciated, changes in the incremental time delay could also be effected by varying the clock rate of either write-in or read-out clocks.

The generalized technique as above-described in accordance with FIGS. 4A thru 4C merely requires the provision of an addressable electronic memory means which has separate write-in and read-out addressing. The time delay technique of the instant invention can be implemented with either a RAM digital memory preceeded by an ADC or a serial analog memory such as the SAM-64 available from Reticon or the Fairchaild CCD 321. Ideally, the digital RAM memory constitutes the preferred approach and such memory should either have simultaneous read/write addressing capabilities, or be able to achieve a sequential read/write operation, all within the basic system clock periods. Integrated circuit registers are readily commercially available having simultaneous read/write ports but such registers as are currently available have relatively few memory cells, requiring a large number of individual chips. Accordingly, the instant invention contemplates a construction of memory registers which effectively performs the novel time delay technique discussed with respect to FIGS. 4A thru 4C, but does so in a fashion utilizing more commonly available memory devices, such as the Schottky TTL RAM's of 256×4 chips, having 50 nanoseconds read or write capability.

Figure 5A:
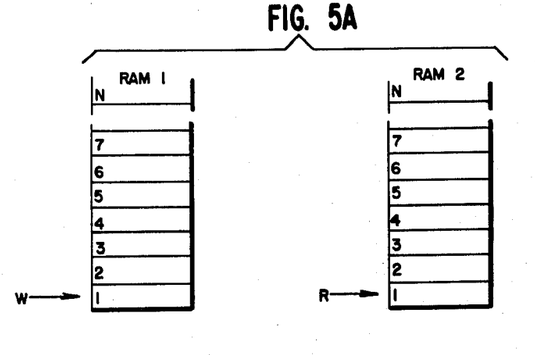
FIGS. 5A thru 5C schematically depict the operation of a sequentially addressable electronic memory means which achieve high speed simultaneous write-in and read-out capabilities of different forms of memory chips.
Figure 5B:
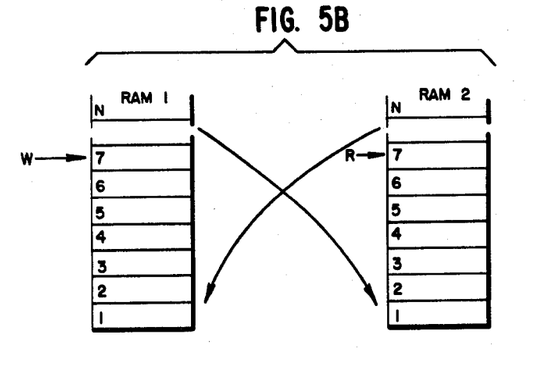
Figure 5C:
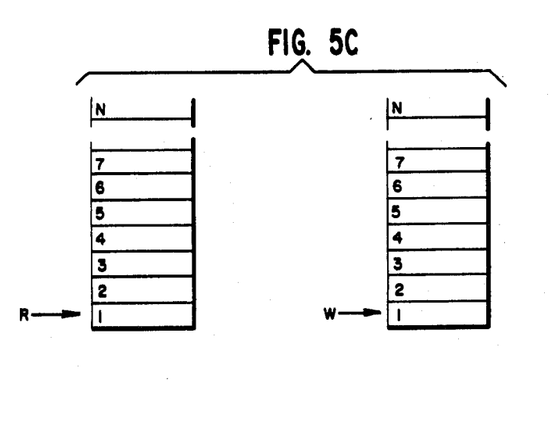

In this respect, and with reference to FIGS. 5A thru 5C of the application drawings, two duplicate memory stacks of the RAM variety are shown, these memories or buffers being utilized in a ping-pong multiplexing scheme to effectively allow simultaneous read and write operations and permit data sampling rates of up to 15–20 MHz. Specifically, one of the memory stacks is utilized for reading-out data, and the other of the memory stacks is utilized for writing-in data. The roles of each of the two memory stacks are periodically interchanged corresponding to the delay intervals required.

For example, and with reference to FIG. 5A of the application drawings, the first memory stack identified as RAM 1 has a write-in address at address level one, whereas the second memory indicated by RAM 2 has its read-out address at address level one. The write-in address of RAM 1 and the read-out address of RAM 2 respectively advance up the memory stacks in accordance with a given clock rate. When the address pointers are at a height corresponding to the delay requested, the pointers automatically reset to address level one, except that the roles of the read and write would be interchanged.

With specific reference to FIG. 5B of the application drawing, for example, and assuming a required delay of 7 clock cycles, when the write-in address of RAM 1 reached the seventh level, at which time the read-out address of RAM 2 would similarly be at the seventh level, the write-in pointer would be automatically returned by external circuitry to the first address level of RAM 2. Similarly, the read pointer of RAM 2 would be automatically "scrolled over" to the first address level of RAM 1. This is indicated in FIG. 5C.

This process of sequencing up through each successive address position or level and then scrolling over and interchanging the read/write roles of each respective memory continues until a modification in the time delay is called for by an external control signal. To decrement a delay, the write pointer or address W is temporarily held or frozen at the same position for the requisite number of clock cycles. Similarly, to increment a delay, the read pointer or address R is temporarily held at the same position for the requisite number of clock cycles. This is in accord with the general principles of the instant invention as was discussed with respect to FIGS. 4A thru 4C, although in this instance, the read/write address pointers would not advance all the way to the top of the memory stack before scroll over, but only to a height or level corresponding to the required interval.

Figure 6:
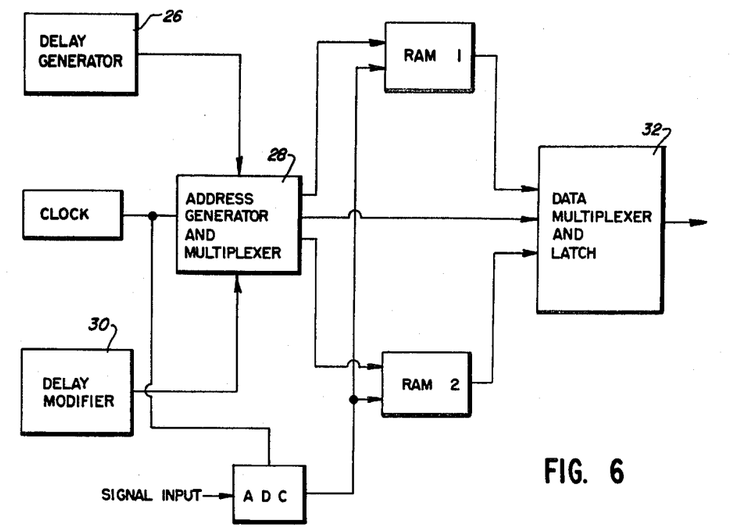
FIG. 6 is an electrical schematic representation of the circuit apparatus utilized to control and select the variable time delay achieved by an electronic digital memory device of the type depicted in FIGS. 5A thru 5C.

Reference is now made to FIG. 6 of the application drawings in which a typical embodiment of a digital line constructed in accordance with the teachings of the instant invention is depicted, such digital delay line utilizing the dual RAM digital memory device in the particular fashion discussed with respect to FIGS. 5A thru 5C. The control means or controller 20 of the generalized embodiment of FIG. 3 is, in this instance, comprised of a delay generator 26, an address generator and multiplexor 28, and a delay modifier 30. Under the control of signals generated by the delay generator 26, the address generator 28 causes the read and write inputs of each of the RAM memories to sequentially index up the respective memory stacks through the various memory levels or positions in accordance with an external non-illustrated clock. The delay generator 26 further serves to fix the maximum level or address position within each memory stack, at which point the read/write pointers of the memory stacks are scrolled in the manner in connection with FIGS. 5B and 5C. To this end, the address generator 28 also provides the so-called "multiplexing" function.

When a change in the initially selected time delay is required, a signal is generated by the delay modifier 30 to the address generator 28, causing either the read address or the write address of the respective RAM memories to "mark time" through a given selected number of clock cycles. In accordance with the techniques discussed concerning the generalized embodiments of FIGS. 4A thru 4C and FIGS. 5A thru 5C, an incremental variation in the time delay would thereby occur. The output from the memories then would be fed through a data multiplexor 32 which would be sequenced in accordance with the multiplexor or "scroll over" signals from address generator 28, which data multiplexor 32 also would contain a data latching or holding mechanism to accomodate the possible occurence of a scroll over or address interchange between the memories taking place during a delay modification procedure. Of course, the signals inputted into each of the memories RAM 1 and RAM 2 would first be passed from each transducer element through a analog-to-digital converter. The output from the data multiplexor and latch then would be passed through a processor and display such as indicated by Reference Nos. 22 and 24 in FIG. 3 of the application drawings, for example. Each of the elements constituting controller 20 as above-described are of conventional construction.

At this point, it should be noted that CCD memories represent one of the least expensive device types capable of clocking rates and bandwidths suitable for use in an ultrasonic imaging system. However, as is known, CCD devices of economical or currently available constructions do not have independent read and write function and therefore are not capable of use as a variable delay line without the novel structure of the present invention.

Figure 7:
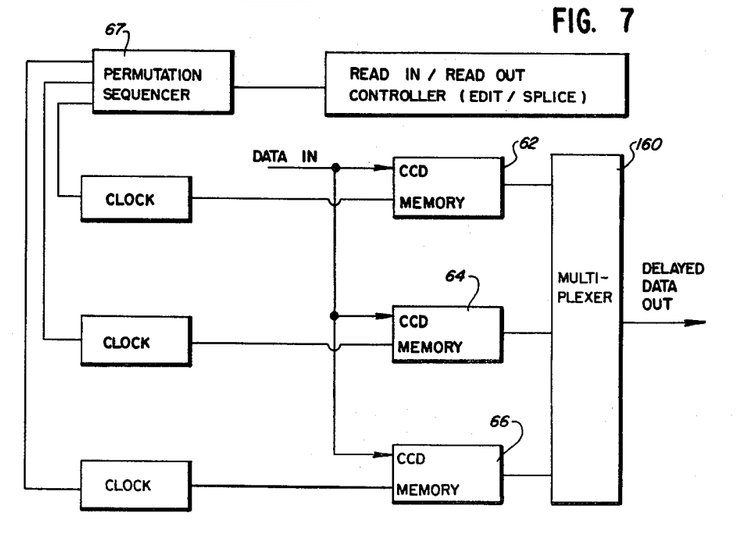
FIG. 7 is an electrical schematic illustration of the instant invention wherein a variable electronic delay line for an ultrasonic imaging system is obtained from the utilization of permutated serial access CCD memory devices.

As shown in FIG. 7 permutating serial-access CCD memories, that is memories which do not have independent read and write function but are of a "pipeline"

character are utilized. Here, CCD Memory 62 is initially loaded with data. After an initial time delay, the memory would be read out under the control of the associated clock. Meanwhile, subsequent data would be input to memory 64. By the time that memory 62 was clocked out memory 64 would be filled, and the data input would be transferred to memory 66 while memory 64 was read out. This cycle would repeat as between the memory registers. Incremental time delays would be implemented either by varying the clock rates (both clock in and clock out rates could potentially be varied to achieve complex non-linear sweep functions), or by utilizing the "edit-splice" techniques and momentarily disabling selective ones of the clocks. It should also be noted that the term "permutation" as used in the present application denotes the switching of a circuit between several inputs or outputs in a fixed repeated sequence.

Figure 8:
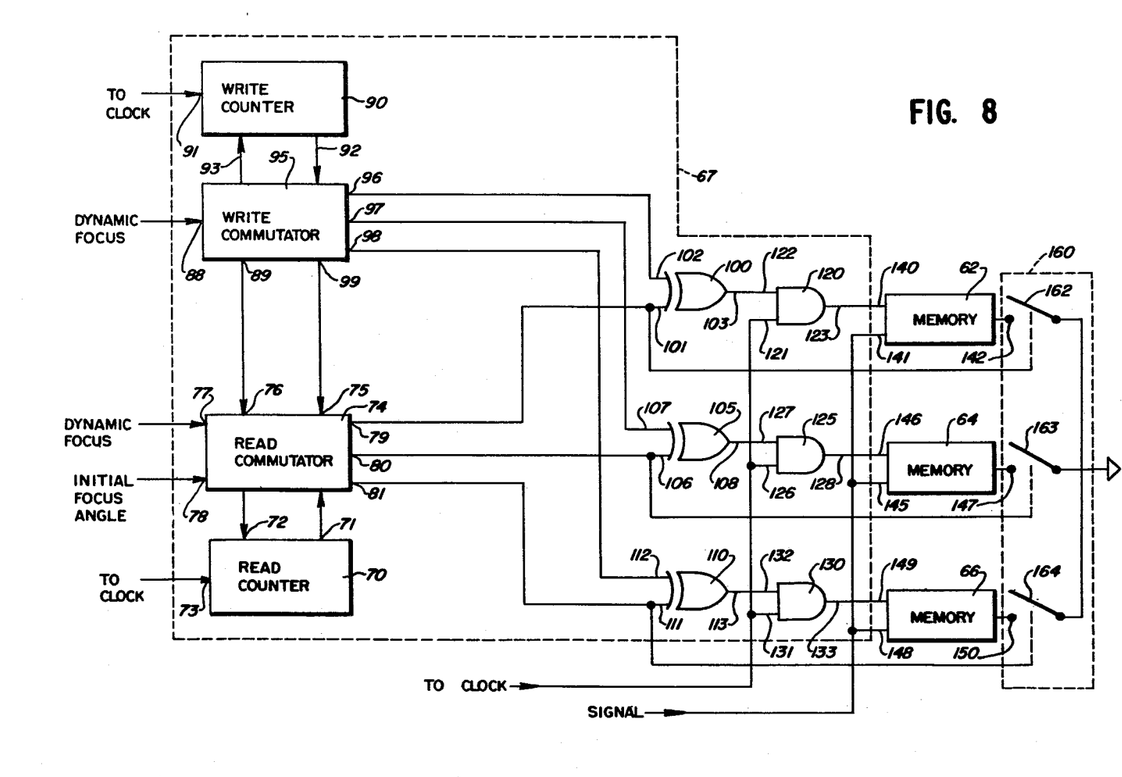
FIG. 8 is a more detailed system diagram of a portion of the present invention variable delay permutating analog shift register system for receiving signals from one of the transducer elements.

FIG. 8 sets forth permutation sequencer 67, CCD memory cells 62, 64 and 66, together with multiplexor 160 in operational relationship. A write counter 90 has a clock signal input terminal 91 connected to a source clock signal and output terminal 92 and an input terminal 93. A write commutator 95 includes a reset terminal 88 output terminals 89, and 99, together with a sequenced trio of write control terminals 96, 97 and 98. A read counter 70 includes a clock signal input terminal 73, an output terminal 71, and an input terminal 72. A read commutator 74 includes an input terminal 78 coupled to a source of inital focus zone and angle information (not shown), and an input terminal 77 coupled to a source of dynamic focus signal (not shown). Read commutator 74 also includes an input terminal 76 coupled to terminal 89 of write commutator 95, and an input terminal 75 coupled to write commutator terminal 99. Read commutator 74 further includes a trio of sequenced output terminals 79, 80 and 81.

An exclusive OR-gate 100 includes a first input terminal 102 coupled to terminal 96 of write commutator 95, a second input terminal 101 coupled to output terminal 79 of read commutator 74, and an output terminal 103. A second exclusive OR-gate 105 also includes an input terminal 107 coupled to output terminal 97 of write commutator 95, an input terminal 106 coupled to output terminal 80 of read commutator 74, and an output terminal 108. A third exclusive OR-gate 110 similarly includes an input terminal 112 connected to output terminal 98 of write commutator 95, and input terminal 111 connected to output terminal 81 of read commutator 74, and an output terminal 113. An AND-gate 120 includes an input terminal 122 coupled to terminal 103 of gate 100, and input terminal 121, and an output terminal 123. A second AND-gate 125 includes an input terminal 127 connected to output terminal 108 of gate 105, an input terminal 126, and an output terminal 128. A third AND-gate 130 includes an input terminal 123 connected to output terminal 113 of gate 110, an input terminal 131, and an output terminal 133. Input terminals 121, 126, and 131 of gates 120, 125 and 130, respectively, are common coupled to a source of clock signal (not shown). A first CCD memory 62 has an input terminal 140 connected to output terminal 123 of gate 120, an input terminal 141, and an output terminal 142. A second CCD memory 64 has an input terminal 146 connected to output terminal 128 of gate 125, an input terminal 145, and an output terminal 147. A third CCD memory 66 has an input terminal 149 connected to output terminal 133 of gate 130 an input terminal 148, and an output terminal 150. Input terminals 141, 145 and 148 of CCD memory's 62, 64 and 66, respectively are commonly coupled to a source of information or "RE" signal (not shown).

A signal multiplexor 160 includes a trio of controllable signal path switches 162, 163 and 164 each respectively coupled between output terminals 142, 147 and 150 of the CCD memories and a common coupling to an RF output terminal 161. The control functions of switches 162, 163 and 164 are operatively connected to terminals 101, and 106 and 111 of gates 100, 105 and 110, respectively.

Turning to the operation of the system set forth in FIG. 8, it is believed that the novel operation thereof is best understood if an initial overview of similified general operational description is provided which is followed by a more specific detailed circuit explanation. The trio of CCD memories each have a like number of storage cells into which data (RF signal) is "clocked in" or "shifted" in a sequential fashion by the application of a train of clock signals. Write commutator 95 and counter 90 co-operate to sequentially store the RF signal in serial fashion first within memory 62 until "full" and then into memory 64 and finally into memory 66. Once memory 66 is full, write commutator 95 returns to memory 62 and begins to shift data into memory 62 once again.

The variable delay function of the system is provided by the above-described edit/splice techniques through the independent operation of read commutator 74 and counter 70. At a time determined by the focal zone and initial angle and focus signals applied to read commutator 74, the signals stored within the first memory filled (memory 62) are shifted out by applied read pulses. Multiplexor 160 at this time responds to read commutator 74 and couples the output of memory 62 to the remainder of the imaging system. The write and read functions continue to sequence or permutate through memories 62, 64 and 66 and the system delay is determined by the number of clock cycles between the shifting in of RF signal and the shifting out of the same. Simply stated, the read function "chases" the write function sequentially through the memory trio and the delay is varied by causing the read function to either catch up (i.e. decreased delay) or fall farther behind (i.e. increased delay).

As will be apparent to those skilled in the art, this interval change may be accomplished by changing the actions of either the write or read functions individually or both in concert. An extremely important aspect of the invention is that the simple analog shift register memories, that is those not having independent write and read functions, eg. CCD's are configured to provide just that.

Turning now to a more detailed operational description, it will be apparent that those skilled in the art can construct numerous embodiments which will operate within the spirit and scope of the present invention. However, the details set forth below describe what is believed to be the preferred embodiment of the present invention. Accordingly with the system considered to be initially at rest, the application of a start pulse to terminal 88 of write commutator 95, causes successive clock signals applied to counter 90. This produces sequential application of output signals to write commutator 95 which responds thereto to produce a D.C. enable voltage at output terminal 96. In turn, this enable voltage causes gate 100 to couple a signal to one input of AND-gate 120. With a simultaneously applied clock signal at 121 of gate 120, gate 120 causes shifting of CCD memory 62.

With each successive pulse produced by the applied clock signal and the DC enable voltage at terminal 96, gates 100 and 120 co-operate to produce shifting or "clocking-in" of the information signal at memory 62. Because the to-be-delayed information signal is continuously applied to input terminal 141 of memory 62, successive shifting of the memory causes sequential storage of the analog information or RF voltage. This "write-in" process continues until counter 90 reaches a predetermined number of pulse counts (corresponding to the number of cells of memory 62). Upon shifting information into all cells within memory 62). Counter 90 produces a signal which causes commutation of write commutator 95. This commutation process may be understood best if one considers the commutator to comprise a rotating switch sequentially energized as the wiper rotates. Accordingly, the DC enabling voltage is transferred from terminal 97 which as set forth above is coupled to the second gate combination in the permutation sequence (i.e. OR-gate 105 and AND-gate 125) which in a similar operation to gates 100, and 120, co-operate to produce a succession of shift signals at terminal 146 of memory 64. Also, in similar manner to memory 62, memory 64 has the analog to-be-delayed RF signal continuously applied to input terminal 145 and successive write pulses at terminal 146 cause sequential shift register storage of coincident portions of the applied to-be-delayed signal. Thus memory 64 is sequentially filled with to-be-delayed date. Once memory 64 is filled, counter 90 again reaches the predetermined count producing a sequencing signal which is applied to write commutator 95 which, in turn, commutates transferring the output of the DC enabling voltage from terminal 97 to 98. After commutation, a third pair of signal gates 130 and 110, which also respond in a similar manner to that of gates 100 and 120, produce sequential storage in a shift register fashion of CCD memory 66. Upon completion of full storage of memory 66, counter 90 once again reaches the predetermined count and causes commutation of write commutator 95 returning the output signal to terminal 96 and causing sequentially occurring data to once again be applied to memory 62.

As can be seen, the return of the DC enabling voltage to terminal 96 will cause gates 100 and 120 to apply a shift pulse to terminal 140 of memory 62, which if memory 62 were still completely filled, would "shift out" the first stored information to terminal 142 and the failure to read out the first stored information prior to the return of enabling write pulses to gates 100 and 120 would cause loss of stored information. Therefore, as can also be seen, the complete filling of all three memories represents the maximum signal delay obtainable by the system which is the time interval corresponding to the sum of individual clock pulse periods in the total number of cells within the memories. At this point it should also be noted that read commutator 74 also includes a trio of sequential output terminals 79, 80 and 81 which in turn are coupled to input terminals 101, 106 and 111 of gates 100, 105 and 110, respectively. In accordance with an important objective of the described system (i.e. that of producing a variable signal delay using the edit/splice techniques described above) the described full storage and permutation sequence set forth above will not normally be completed prior to the activation of read commutator 74. The applied focus zone and scan angle signals at terminals 77 and 78 of read commutator 74 causes the generation of a DC enable voltage at terminal 79 once the desired initial signal delay has been obtained. Upon the application of an enable voltage from terminal 79 to terminal 101 of gate 100, memory 62 (which at this point will have been filled) will be shifted causing an output of delayed data at terminal 142. As mentioned, the occurrence of the DC enable voltage at terminal 101 causes switch 162 of multiplexor 160 will be operatively "closed" coupling the shifted-out signal from terminal 142 to terminal 161. As the DC enable voltage is maintained at terminal 79, gates 100 and 120 cooperate to sequentially shift the data stored within the memory out which is then coupled via switch 162 to terminal 161. As set forth above, the incremental delay experienced by a given signal corresponds to the number of clock cycles occurring between the application of a DC enabling voltage from write commutator 95 causing storage of the signal within memory 62 and the application of a DC enable voltage from terminal 79 causing the successive shifting out of the signal at output terminal 142 of memory 62.

When all the data stored within memory 62 has been shifted out, counter 70 causes a sequence signal applied via terminal 71 to read commutator 74 to transfer or commutate the output of the DC enable voltage from terminal 79 to terminal 80 thereby activating the combination of gates 105 and 125 and beginning the shifting of information now stored in memory 64. This process continues and the successively stored information within memory 64 is sequentially or serially shifted to output terminal 147 of memory 64. Also as mentioned above, the occurrence of a read pulse, in addition to shifting the memory, cause operative closing of the appropriate switch segment within multiplexor 160. Therefore, successively shifted out information signal portions at terminal 147 are coupled via switch 163 to output terminal 161 of multiplexor 160 in similar fashion to that provided by the action of switch 162 during shifting of memory 62. Once again, when a sufficient number of read pulses have been applied to memory 64 to cause the shifting out of all information stored therein, counter 70 activates read commutator 74 to transfer the DC enable voltage from terminal 80 to 81 and thereby activating gates 110 and 130 to begin sequential shifting out of information stored in memory 66. As would be expected, the application of a DC enabling voltage to gate 110 simultaneously causes an operative closing of switch section 164 coupling the shifted out information from memory 66 to output terminal 161 of multiplexor 160.

The above described signal delay operation may in accordance with known imaging techniques be utilized in both the delay transducer activating signals (that is, those launching acousting signals) and the processing of returning echo information received at the transducers from boundry layers within the patient anatomy. In general, however, the present invention delay system is of greater advantage in the processing of returning echo signals. It is generally regarded as more cost effective to use digital delay techniques to phase the launching signals. Because the storage of information within memories 62, 64 and 66 and the retrieval therefrom may be independently controlled utilizing the described system, the present invention system has great advantage in an edit/splice function of an imaging system. However, it will be apparent to those skilled in the art that the present invention system's permutation sequencing between a plurality of analog shift register devices (in this case trio of CCD memories) provides a system in which relatively low cost memory devices, which of themselves do not have independent read and write function are used in a novel combination whereby the resulting system provides independent control of read and write functions.

It should now be apparent that the objectives set forth at the outset of this specification have been successfully achieved. Accordingly,

We claim:

1. Variable delay analog signal means comprising:
a plurality of analog shift register memories;
a source of clock signals;
a source of to-be-delayed signal, coupled to each of said memories;
commutating write means, coupled to said source of clock signals, and said plurality of memories, for applying to each of said memories in a predetermined repetative sequence a succession of shift signals causing said memories to turn to be serially filled with portions of said to-be delayed signal;
commutating read means, coupled to said source of clock signals and said plurality of memories, for applying a succession of shift signals to said memories to retrieve therefrom said portions of said to-be delayed signal stored therein, said commutating read means being operative so that such retrieving operation is independent of but follows by a time interval said filling operation of said commutating write means in said predetermined repetative sequence; and
edit/splice means for altering the time interval between said data retrieval and said filling operation to produce dynamic variation of delay.

* * * * *